(12) United States Patent
Sugiyama

(10) Patent No.: US 6,809,988 B2
(45) Date of Patent: Oct. 26, 2004

(54) SEMICONDUCTOR MEMORY WITH ADDRESS INPUT SELECTION CIRCUITS

(75) Inventor: Takashi Sugiyama, Ikoma-gun (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/376,019

(22) Filed: Feb. 26, 2003

(65) Prior Publication Data

US 2003/0161202 A1 Aug. 28, 2003

(30) Foreign Application Priority Data

Feb. 28, 2002 (JP) ........................................ 2002-054367

(51) Int. Cl.$^7$ .............................. G11C 8/10; G11C 8/20
(52) U.S. Cl. ............................ 365/230.06; 365/230.02; 365/200
(58) Field of Search .......................... 365/200, 230.08, 365/230.03, 230.04, 230.02, 231, 230.06

(56) References Cited

U.S. PATENT DOCUMENTS 5,905,683 A * 5/1999 McClure ..................... 365/200
6,006,313 A * 12/1999 Fukumoto ................... 711/211
6,295,595 B1 * 9/2001 Wildenberg et al. ........ 711/211
6,693,831 B2 * 2/2004 Park ........................... 365/200

FOREIGN PATENT DOCUMENTS

JP 59-040392 3/1984
JP 2001-028198 1/2001

* cited by examiner

Primary Examiner—Richard Elms
Assistant Examiner—J. H. Hur
(74) Attorney, Agent, or Firm—Morrison & Foerster LLP

(57) ABSTRACT

A semiconductor memory having a plurality of memory cells includes a plurality of address pads for receiving plural address data bits, a plurality of address buffers for applying the address data bits to corresponding address decoders, and a plurality of address input selection circuits respectively provided between the address pads and the address buffers. The address input selection circuits each select one of a signal fixed at either the L-level or the H-level, a signal indicative of the address data bit applied from the corresponding address pad and a signal indicative of the address data bit applied from the address pad at the one-bit lower hierarchical level than the corresponding address pad, and then output the selected signal to the corresponding address buffer.

8 Claims, 6 Drawing Sheets

FIG. 4

| S1 | S2 | ADi |
|----|----|-----|
| 0  | 0  | 0   |
| 0  | 1  | 1   |
| 1  | 0  | Ai  |
| 1  | 1  | Ai-1 |

PRIOR ART

PRIOR ART

SEMICONDUCTOR MEMORY WITH ADDRESS INPUT SELECTION CIRCUITS

CROSS-REFERENCE TO RELATED APPLICATION

This application is related to Japanese application JP 2002-054367 filed on Feb. 28, 2002, whose priority is claimed under 35 USC § 119, the disclosure of which is incorporated by reference in its entirety.

BACKGROUND OF THE INVENTION

1. Field of the Invention

The present invention relates to a semiconductor memory and, more specifically, to a semiconductor memory which, if having a defective memory cell therein, can be used as a memory having a smaller memory capacity than its original capacity without using an area in which the defective memory cell is present.

2. Description of the Related Art

An exemplary semiconductor memory of the aforesaid type is disclosed in Japanese Unexamined Patent Publication No. SHO 59 (1984)-40392. The construction of this semiconductor memory will be described with reference to FIG. 6.

FIG. 6 illustrates an address data input section of the semiconductor memory. In FIG. 6, there are shown address input terminals (hereinafter referred to as "pins") $11_0$ to $11_n$ for receiving plural address data bits $A_0$ to $A_n$ respectively supplied thereto, and address buffers $12_0$ to $12_n$ provided in one-to-one correspondence with the respective pins $11_0$ to $11_n$ for outputting address data pairs $A_0, \overline{A_0}$ ($\overline{A_0}$: the inverse of $A_0$), $A_1, \overline{A_1}, \ldots$, and $A_n, \overline{A_n}$ each having a complementary relationship on the basis of the address data bits $A_0$ to $A_n$.

Enhancement-mode MOSFETs $13_0$ to $13_n$ are respectively inserted between the pins $11_0$ to $11_n$ and the corresponding address buffers $12_0$ to $12_n$ with drains and sources thereof connected to the pins $11_0$ to $11_n$ and the address buffers $12_0$ to $12_n$. Further, enhancement-mode MOSFETs $14_0$ to $14_{n-1}$ are respectively inserted between the pins $11_0$ to $11_{n-1}$ and input terminals of the address buffers $12_1$ to $12_n$ at one-bit higher hierarchical levels with drains and sources thereof connected to the pins $11_0$ to $11_{n-1}$ and the address buffers $12_1$ to $12_n$.

Gates of the MOSFETs $13_0$ to $13_n$ are connected via a common interconnection line 15, while gates of the MOSFETs $14_0$ to $14_{n-1}$ are connected via a common interconnection line 16.

An upper end of the interconnection line 15 as seen in FIG. 6 is connected to a positive power supply voltage $V_{DD}$ via a depletion-mode MOSFET 17. A gate of the MOSFET 17 is also connected to the power supply voltage $V_{DD}$. A lower end of the interconnection line 15 as seen in FIG. 6 is connected to a reference power supply voltage $V_{SS}$ via a depletion-mode MOSFET 18. A gate of the MOSFET 18 is also connected to the power supply voltage $V_{SS}$. The MOSFETs 17, 18 are each properly dimensioned so that the interconnection line 15 is kept at a logic "1" level.

Where a logic circuit is employed which is operative on the basis of a 0-V signal defined as an L-level signal (low level signal) and a 5-V signal defined as an H-level signal (high level signal), for example, a logic "0" level and a logic "1" level herein mean the L-level signal and the H-level signal, respectively.

An upper end of the interconnection line 16 as seen in FIG. 6 is connected to the reference power supply voltage $V_{SS}$ via a depletion-mode MOSFET 19. A gate of the MOSFET 19 is also connected to the power supply voltage $V_{SS}$. A lower end of the interconnection line 16 as seen in FIG. 6 is connected to the power supply voltage $V_{DD}$ via a depletion-mode MOSFET 20. A gate of the MOSFET 20 is also connected to the power supply voltage $V_{DD}$. The MOSFETs 19, 20 are each properly dimensioned so that the interconnection line 16 is kept at the logic "0" level.

FIGS. 7(a) and 7(b) illustrate address fixing circuits provided at address data output terminals of each of the address buffers $12_0$ to $12_n$. The address fixing circuits are adapted to fix the output data $A_i, \overline{A_i}$ at given levels on the basis of control signals $F_{11}, F_{12}$ irrespective of the address data applied to the output terminals. As shown in FIGS. 7(a) and 7(b), the address fixing circuits respectively include a pair of enhancement-mode MOSFETs 31, 32 and a pair of enhancement-mode MOSFETs 33, 34.

The address data input section of the semiconductor memory is operative in the following manner. In a normal operation, all the MOSFETs $13_0$ to $13_n$ are in an ON state, and all the MOSFETs $14_0$ to $14_{n-1}$ are in an OFF state. Therefore, the address data bits $A_0$ to $A_n$ respectively supplied to the pins $11_0$ to $11_n$ are transferred to the input terminals of the corresponding address buffers $12_0$ to $12_n$ via the MOSFETs $13_0$ to $13_n$ the ON state. In this case, memory cells (not shown) of the semiconductor memory are all addressable on the basis of the address data bits $A_0$ to $A_n$. That is, none of the memory cells of the semiconductor memory is defective.

FIG. 5 illustrates a memory cell array. It is assumed that a left half of the memory cell array is designated by an address data value $A_n=0$ and a right half of the memory cell array is designated by an address data value $A_n=1$. An explanation will be given to a case where a defective memory cell occurs in an area X in FIG. 5, i.e., in a memory area designated by the address data value $A_n=0$.

In this case, the memory area (area X) designated by the address data value $A_n=0$ is not used. To this end, the control signals $F_{11}$ to be applied to the address fixing circuits (FIGS. 7(a) and 7(b)) in the address buffer $12_n$ are set at the "1" level. As a result, the address data value $A_n$ is set at $A_n=1$ irrespective of the value of the address data bit supplied to the pin $11_n$, so that the memory area designated by the address data value $A_n=0$ is not selected.

Therefore, even if the defective memory cell occurs in the area designated by the address data value $A_n=0$ in the semiconductor memory, the semiconductor memory can be used as a memory having a memory capacity one half its original capacity without using the bin $11_n$ at the highest hierarchical level.

Next, an explanation will be given to a case where defective memory cells occur in areas W1, W3 in FIG. 5, i.e., memory areas designated by an address data value $A_{n-1}=0$.

In this case, the memory areas (areas W1, W3) designated by the address data value $A_{n-1}=0$ are not used. To this end, the control signals $F_{11}$ to be applied to the address fixing circuits (FIGS. 7(a) and 7(b)) in the address buffer $12_{n-1}$ are set at the "1" level. As a result, the address data value $A_{n-1}$ is set at $A_{n-1}=1$ irrespective of the value of the address data bit supplied to the pin $11_{n-1}$, so that the memory areas designated by the address data value $A_{n-1}=0$ are not selected.

In this case, the MOSFETs $13_0$ to $13_{n-2}$ and $14_{n-1}$ are set in the ON state, and the MOSFETs $14_0$ to $14_{n-2}, 13_{n-1}$ and $13_n$ are set in the OFF state for shifting a transfer line for the address data bit $A_{n-1}$.

This setting is achieved by isolating the interconnection lines 15 and 16 from the MOSFETs 17 and 19, respectively. More specifically, the interconnection lines 15, 16 are composed of polycrystalline silicon or aluminum. The interconnection line 15 is fused off between gate junctions of the MOSFETs $13_{n-2}$ and $13_{n-1}$ and the interconnection line 16 is fused off between gate junctions of the MOSFETs $14_{n-2}$ and $14_{n-1}$ by laser radiation.

Thus, a part of the interconnection line 15 between the gate of the MOSFET $13_{n-1}$ and the MOSFET 18 which has been kept at the logic "1" level is set at the logic "0" level, so that the MOSFETs $13_{n-1}$, $13_n$ are turned off. Further, a part of the interconnection line 16 between the gate of the MOSFET $14_{n-1}$ and the MOSFET 20 which has been kept at the logic "0" level is set at the logic "1" level, so that the MOSFET $14_{n-1}$ is turned on.

By this operation, the transfer line for the address data bit $A_{n-1}$ is shifted, and the output of the address buffer $12_{n-1}$ initially corresponding to the address data bit $A_{n-1}$ is fixed. Nevertheless, it looks as if the address data value $A_n$ was fixed.

Therefore, even if the defective memory cells occur in the areas designated by the address data value $A_{n-1}=0$ in the semiconductor memory, the semiconductor memory can be used as a memory having a memory capacity one half its original capacity without using the bin $11_n$ at the highest hierarchical level.

Another exemplary semiconductor memory of the aforesaid type disclosed in Japanese Unexamined Patent Publication No. 2001-28198 is adapted to fix an address signal by fusing off a fuse. The semiconductor memory employs a circuit as shown in FIG. 8 for fixing address data at a logic "0" level or a logic "1" level.

In FIG. 8, there are shown an address pad (a) to which the address data is inputted, P-channel transistors (b) and (c), N-channel transistors (j), (k) and (g), and fuses (d), (e), (f), (h) and (i).

The address pad (a) is connected to an address buffer via the fuse (f). The P-channel transistor (b) has a gate connected to the ground GND, a source connected to a power supply voltage $V_{cc}$, and a drain connected to a drain of the N-channel transistor (j) via the fuses (d) and (h). The N-channel transistor (j) has a gate connected to the power supply voltage $V_{cc}$, and a source connected to the ground GND.

The P-channel transistor (c) has a gate connected to the ground GND, a source connected to the power supply voltage $V_{cc}$, and a drain connected to a drain of the N-channel transistor (k) via the fuses (e) and (i). The N-channel transistor (k) has a gate connected to the power supply voltage $V_{cc}$, and a source connected to the ground GND.

A reference character (A) denotes a node for interconnection between the P-channel transistor (b) and the N-channel transistor (j), and a reference character (B) denotes a node for interconnection between the P-channel transistor (c) and the N-channel transistor (k). The N-channel transistor (g) has a gate connected to the node (B), a source connected to the node (A), and a drain connected to the address buffer.

The P-channel transistors (b) and (c) and the N-channel transistors (j) and (k) are properly dimensioned so that potentials at the nodes (A) and (B) are set at the logic "1" level and the logic "0" level, respectively.

An explanation will be given to a case where the full memory capacity of the semiconductor memory is available for reading, i.e., bit data applied to the address pad is inputted as it is to the address buffer.

In this case, the polysilicon fuses (d), (h), (e), (i) are fused off. As a result, the input from the address pad (a) is inputted to the address buffer via the polysilicon fuse (f). Thus, the full memory capacity of the semiconductor memory is available for reading.

Next, an explanation will be given to a case where the input to the address buffer is fixed at the logic "0" level.

In this case, the fuse (f) is fused off by laser radiation or the like, so that the input from the address pad is prevented from being applied to the address buffer. Then, the potential at the node (A) is set at the logic "0" level by fusing off the fuse (d). Further, the potential at the node (B) is set at the logic "1" level by fusing off the fuse (i). Thus, the N-channel transistor (g) is turned on.

As a result, the potential (logic "0" level) at the node (A) is inputted as it is to the address buffer. Therefore, the input to the address buffer is fixed at the logic "0" level irrespective of the value of the address data.

Next, an explanation will be given to a case where the input to the address buffer is fixed at the logic "1" level.

In this case, the fuse (f) is fused off by laser radiation or the like so that the input from the address pad is prevented from being applied to the address buffer. Then, the potential at the node (A) is set at the logic "1" level by fusing off the fuse (h). Further, the potential at the node (B) is set at the logic "1" level by fusing off the fuse (i). Thus, the N-channel transistor (g) is turned on.

As a result, the potential (logic "1" level) at the node (A) is inputted as it is to the address buffer. Therefore, the input to the address buffer is fixed at the logic "1" level irrespective of the value of the address data.

In the case of the semiconductor memory disclosed in Japanese Unexamined Patent Publication No. SHO 59 (1984)-40392, however, the interconnection line 15 is kept at the logic "1" level by the MOSFETs 17, 18, and the interconnection line 16 is kept at the logic "0" level by the MOSFETs 19, 20. Where no defective memory cell is present in the memory areas, i.e., the full memory capacity is available, electric currents flow through the interconnection lines 15 and 16, so that the power is constantly consumed.

The semiconductor memory disclosed in Japanese Unexamined Patent Publication No. 2001-28198 is free from the wasteful power consumption by the interconnection lines, but requires the laser radiation for fusing off the fuses. Therefore, it is impossible to fix address data after the assembling to remedy a defective product.

SUMMARY OF THE INVENTION

In view of the foregoing, the present invention is directed to a semiconductor memory which is capable of controlling the passage, fixing and shifting of address data by means of a single circuit for prevention of wasteful power consumption thereof and, even if having a defective memory cell after the assembling thereof, can be used as an acceptable device having a smaller memory capacity than its original capacity without changing the positions of address input terminals.

The present invention provides a semiconductor memory having a plurality of memory cells, comprising: a plurality of address pads for receiving plural address data bits respectively inputted thereto for designating memory cell areas; a plurality of address buffers provided in one-to-one correspondence with the address pads for applying the address data bits to corresponding address decoders for selecting any of the memory cell areas; and a plurality of address input selection circuits respectively provided between the address pads and the address buffers; wherein the address input selection circuits each receive two control signals each having either an L-level or an H-level, an address data bit applied from a corresponding one of the address pads and an address data bit applied from an address pad at a one-bit lower hierarchical level than the corresponding address pad, then select one of a signal fixed at either the L-level or the H-level, a signal indicative of the address data bit applied from the corresponding address pad and a signal indicative of the address data bit applied from the address pad at the one-bit lower hierarchical level than the corresponding address pad on the basis of the levels of the two control signals, and output the selected signal to the corresponding address buffer.

According to the present invention, the address input selection circuit selects one of the signal fixed at either the L-level or the H-level, the signal indicative of the address data bit applied from the corresponding address pad and the signal indicative of the address data bit applied from the address pad at the one-bit lower hierarchical level than the corresponding address pad on the basis of the levels of the two control signals, and outputs the selected signal to the corresponding address buffer.

Therefore, where no defective memory cell is present in the semiconductor memory, the address data bit from the corresponding address pad can be outputted as it is to the corresponding address buffer by properly setting the levels of the two control signals to be inputted to the address input selection circuit.

Where a defective memory cell is present in an area of the semiconductor memory, an address data bit corresponding to the defective memory area can be fixed. In this case, an address input selection circuit at a lower hierarchical level than the address input selection circuit having the fixed bit can output an address data bit applied from the corresponding address pad to the corresponding address buffer on an "as is" basis. Further, an address input selection circuit at a higher hierarchical level than the address input selection circuit having the fixed bit can output an address data bit applied from an address pad at a one-bit lower hierarchical level than the corresponding address pad to the corresponding address buffer.

Even if a defective memory cell occurs in an area corresponding to any address data bit in the semiconductor memory after the assembling, the semiconductor memory can be used as an acceptable device having a smaller memory capacity than its original capacity without changing the positions of address input terminals. Thus, the semiconductor memory can be remedied. Further, the semiconductor memory is free from wasteful power consumption.

BRIEF DESCRIPTION OF THE DRAWINGS

FIG. 4 is an explanatory diagram illustrating a relationship between the status of control signals and an output to an address buffer;

DESCRIPTION OF THE PREFERRED EMBODIMENT

The semiconductor memory of the present invention may be any of various types of semiconductor memories, as long as it has a plurality of memory cells. Examples of the semiconductor memory include RAMs such as static RAMs (SRAMs) and dynamic RAMs (DRAMs), and ROMs such as mask ROMs, PROMs, EPROMs, EEPROMs and EAROMs.

In the present invention, a plurality of address pads are provided for receiving plural address data bits respectively inputted thereto for designating memory cell areas. Where the semiconductor memory has ten address inputs $A_0$ to $A_{n-1}$ (n=10), for example, ten address data bits are respectively inputted to ten address pads. The address pads may be any of various types of address pads known in the art.

A plurality of address buffers are provided in one-to-one correspondence with the address pads for applying the address data bits to corresponding address decoders for selecting any of the memory cell areas. The address buffers may be any of various types of address buffers known in the art.

Address input selection circuits are respectively provided between the address pads and the address buffers. Therefore, the address pads, the address buffers and the address input selection circuits are equal in number in the present invention.

The address input selection circuits each receive two control signals each having either an L-level or an H-level, an address data bit applied from a corresponding one of the address pads and an address data bit applied from an address pad at a one-bit lower hierarchical level than the corresponding address pad. The expression "two control signals each having either an L-level or an H-level" means that the two control signals each have either a logic "0" level or a logic "1" level.

The address input selection circuits each select one of a signal fixed at either the L-level or the H-level, a signal indicative of the address data bit applied from the corresponding address pad and a signal indicative of the address data bit applied from the address pad at the one-bit lower hierarchical level than the corresponding address pad on the basis of the levels of the two control signals, and output the selected signal to the corresponding address buffer.

With reference to the drawings, the present invention will hereinafter be described in detail by way of an embodiment thereof. It should be understood that the invention is not limited to the embodiment, but various modifications may be made thereto.

Figure 1:
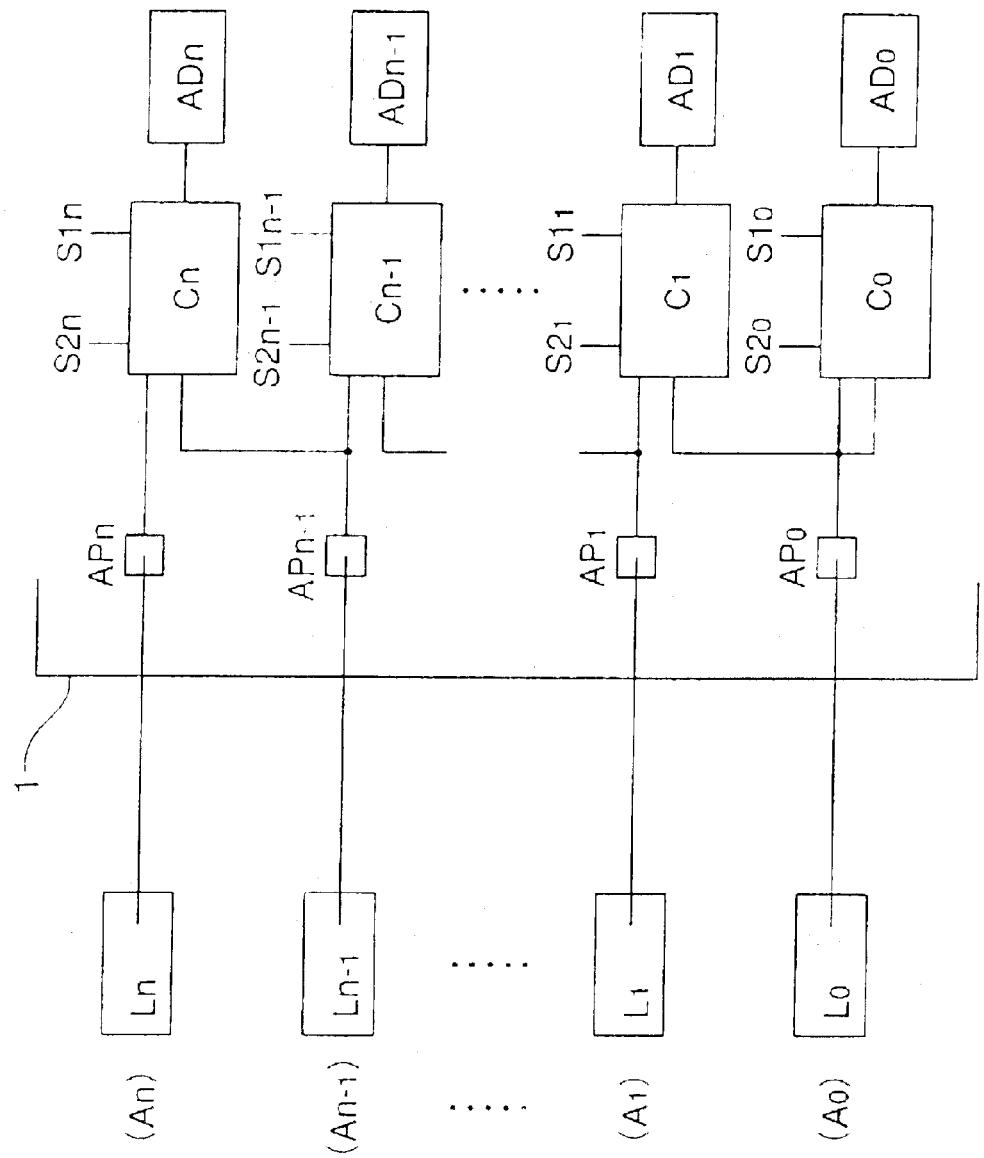
FIG. 1 is a block diagram illustrating an address data input section of a semiconductor memory according to the present invention.

FIG. 1 is a block diagram illustrating an address data input section of a semiconductor memory according to the present invention.

In FIG. 1, there is shown the semiconductor memory 1, which includes address input terminals $L_i$ (i=0 to n (wherein n is an integer not smaller than 1), address pads $AP_i$, address buffers $AD_i$ and address input selection circuits $C_i$.

Address data bits $A_i$ are respectively inputted to the address input terminals $L_i$ for designating addresses in the semiconductor memory 1. Here, an address data bit $A_0$ is at the lowest hierarchical level, and an address data bit $A_n$ is at the highest hierarchical level. The address data bits are each 1-bit data, which takes either a logic "0" level (L-level) or a logic "1" level (H-level).

The pin connections of the semiconductor memory are fixed. Where each word is constituted by 8 bits and the semiconductor memory has address inputs $A_0$ to $A_{n-1}$ (n=10), for example, the semiconductor memory is housed in a DIP package with 24 pins and adapted to receive the respective address data bits supplied to corresponding pins.

To establish compatibility between systems employing semiconductor memories with different memory capacities, e.g., between an 8-kilobit memory and a 16-kilobit memory, pins for receiving address data bits $A_0$ to $A_{n-1}$ in the 8-kilobit memory are located at the same positions as pins for receiving address data bits $A_0$ to $A_{n-1}$ in the 16-kilobit memory.

In the 16-kilobit memory, a pin for receiving the address data bit $A_n$ at the highest hierarchical level is available but, in the 8-kilobit memory, is just present without interconnection.

Where a defective memory cell is present in a part of the 16-kilobit memory, the address data bit $A_n$ at the highest hierarchical level is fixed at the "0" or "1" level, whereby the 16-kilobit memory can be used as an 8-kilobit memory having a memory capacity one half its original capacity.

The address pads $AP_i$ are provided in one-to-one correspondence with the address input terminals $L_i$. Further, the address buffers $AD_i$ are provided in one-to-one correspondence with the address pads $AP_i$.

The address input selection circuits $C_i$ are respectively provided between the address pads $AP_i$ and the address buffers $AD_i$. The address input selection circuits $C_i$, the address pads $AP_i$ and the address buffers $AD_i$ are equal in number.

The address input terminals $L_i$ are respectively connected to the address pads $AP_i$, which are respectively connected to the address buffers $AD_i$ via the address input selection circuits $C_i$.

The address input selection circuits $C_i$ are further connected to the address pads $AP_{i-1}$ at one-bit lower hierarchical levels than the corresponding address input selection circuits $C_i$. That is, the address input selection circuit $C_n$ at the highest hierarchical level is connected to the address pad $AP_{n-1}$ at a one-bit lower hierarchical level than the address input selection circuit $C_n$, and the address input selection circuit $C_{n-1}$ at the second highest hierarchical level is connected to the address pad $AP_{n-2}$ at a one-bit lower hierarchical level than the address input selection circuit $C_{n-1}$. Similarly, the address input selection circuit $C_1$ at the second lowest hierarchical level is connected to the address pad $AP_0$ at the lowest hierarchical level. The address input selection circuit $C_0$ at the lowest hierarchical level is connected to the address pad $AP_0$ at the lowest hierarchical level through short circuit.

This interconnection configuration is designed so that the address buffers $AD_i$ can be shifted to one-bit higher hierarchical levels with respect to the address pads $AP_i$.

The address input selection circuits $C_i$ are each connected to control signals $S1_i$, $S2_i$. The outputs of the address input selection circuits $C_i$ are respectively applied to the corresponding address buffers $AD_i$.

Figure 2:
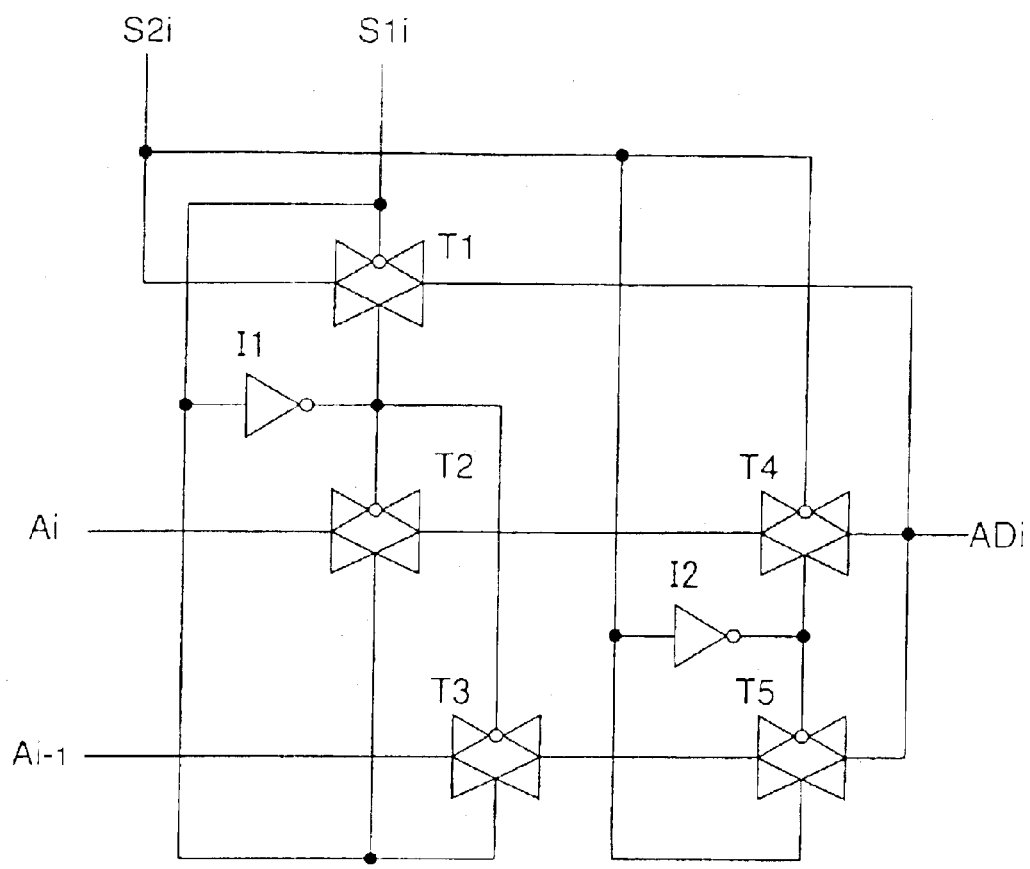
FIG. 2 is a circuit block diagram illustrating the construction of an address input selection circuit.

FIG. 2 is a circuit block diagram illustrating the construction of the address input selection circuit $C_i$.

The address input selection circuit $C_i$ includes five transfer gates $T_1$ to $T_5$, and two invertors $I_1$, $I_2$. The control signals $Si_i$, $S2_i$ can be set at either the logic "0" level or the logic "1" level. The output to the address buffer $AD_i$ is changed according to four logic statuses (0,0), (0,1), (1,0) and (1,1) of the control signals $S1_i$, $S2_i$.

An explanation will be given to the connection of the address input selection circuit $C_i$.

A line for an address data bit $A_i$ from a given address pad $AP_i$ is connected to the address buffer $AD_i$ via the transfer gates $T_2$, $T_4$. A line for an address data bit $A_{i-1}$ from an address pad $AP_{i-1}$ at a one-bit lower hierarchical level than the address pad $AP_i$ is connected to the address buffer $AD_i$ via the transfer gates $T_3$, $T_4$.

Figure 3:
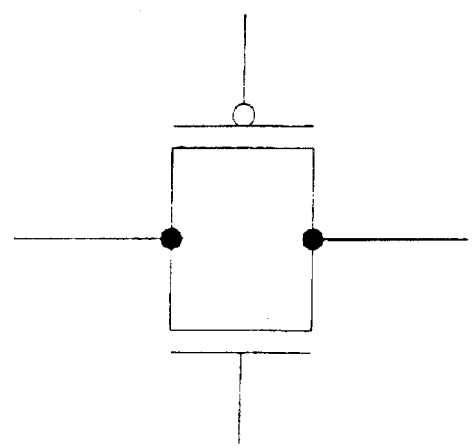
FIG. 3 is an explanatory diagram illustrating the construction of a transfer gate.

As shown in FIG. 3, the transfer gates $T_1$ to $T_5$ are each constituted by an enhancement-mode P-channel MOSFET (on the upper side in FIG. 3), and an enhancement-mode N-channel MOSFET (on the lower side in FIG. 3).

A line for the control signal $S1_i$ is connected to a gate of the P-channel MOSFET of the transfer gate $T_1$ and gates of the N-channel MOSFETs of the transfer gates $T_2$, $T_3$, and further connected to a gate of the N-channel MOSFET of the transfer gate $T_1$ and gates of the P-channel MOSFETs of the transfer gates $T_2$, $T_3$ via the invertor $I_1$.

A line for the control signal $S2_i$ is connected to a gate of the P-channel MOSFET of the transfer gate $T_4$ and a gate of the N-channel MOSFET of the transfer gate $T_5$, and further connected to a gate of the N-channel MOSFET of the transfer gate $T_4$ and a gate of the P-channel MOSFET of the transfer gate $T_5$ via the invertor $I_2$.

Next, an explanation will be given to the output of the address input selection circuit for each of the logic statuses of the control signals S1, S2.

(1) Where the logic status of the control signals S1, S2 is (0,0), the transfer gates $T_1$, $T_4$ are turned on and the transfer gates $T_2$, $T_3$, $T_5$ are turned off. Therefore, the level (logic "0" level) of the control signal S2 is outputted to the address buffer $AD_i$ via the transfer gate $T_1$.

(2) Where the logic status of the control signals S1, S2 is (0,1), the transfer gates $T_1$, $T_5$ are turned on and the transfer gates $T_2$, $T_3$, $T_4$ are turned off. Therefore, the level (logic "1" level) of the control signal S2 is outputted to the address buffer $AD_i$ via the transfer gate $T_1$.

(3) Where the logic status of the control signals S1, S2 is (1,0), the transfer gates $T_2$, $T_3$, $T_4$ are turned on and the transfer gates $T_1$, $T_5$ are turned off. Therefore, the address data bit $A_i$ is outputted as it is to the address buffer $AD_i$ via the transfer gates $T_2$, $T_4$.

(4) Where the logic status of the control signals S1, S2 is (1,1), the transfer gates $T_2$, $T_3$, $T_5$ are turned on and the transfer gates $T_1$, $T_4$ are turned off. Therefore, the address data bit $A_{i-1}$ at a one-bit lower hierarchical level is outputted to the address buffer $AD_i$ via the transfer gates $T_3$, $T_5$.

Figure 4:
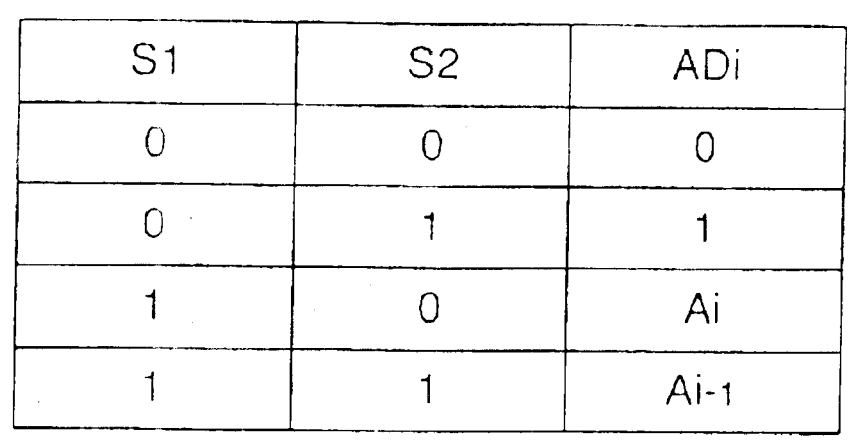

FIG. 4 is an explanatory diagram illustrating a relationship between the status of the control signals S1, S2 and the output to the address buffer $AD_i$. As shown, the output to the address buffer $AD_i$ is changed on the basis of the status of the control signals S1, S2.

Figure 5:
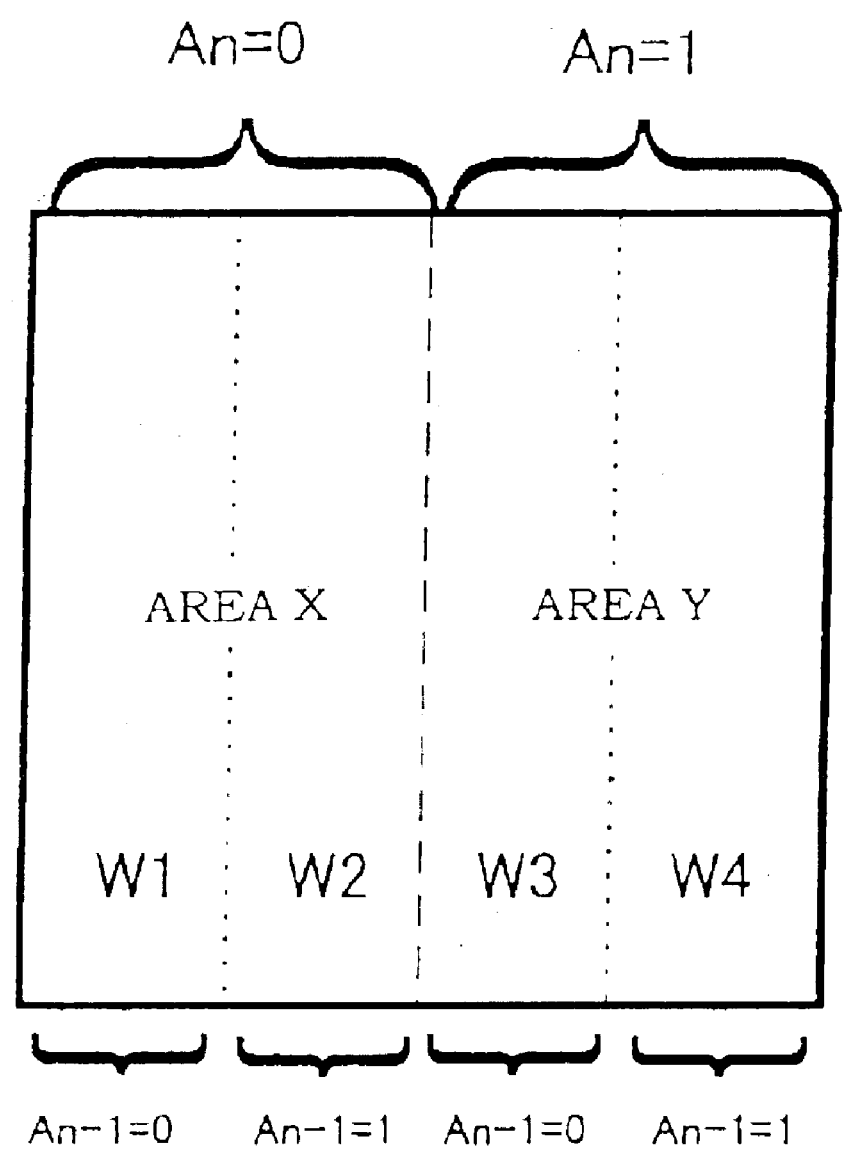
FIG. 5 is an explanatory diagram illustrating a relationship between an address data value and an area designated by the address data value in the semiconductor memory.
Figure 6:
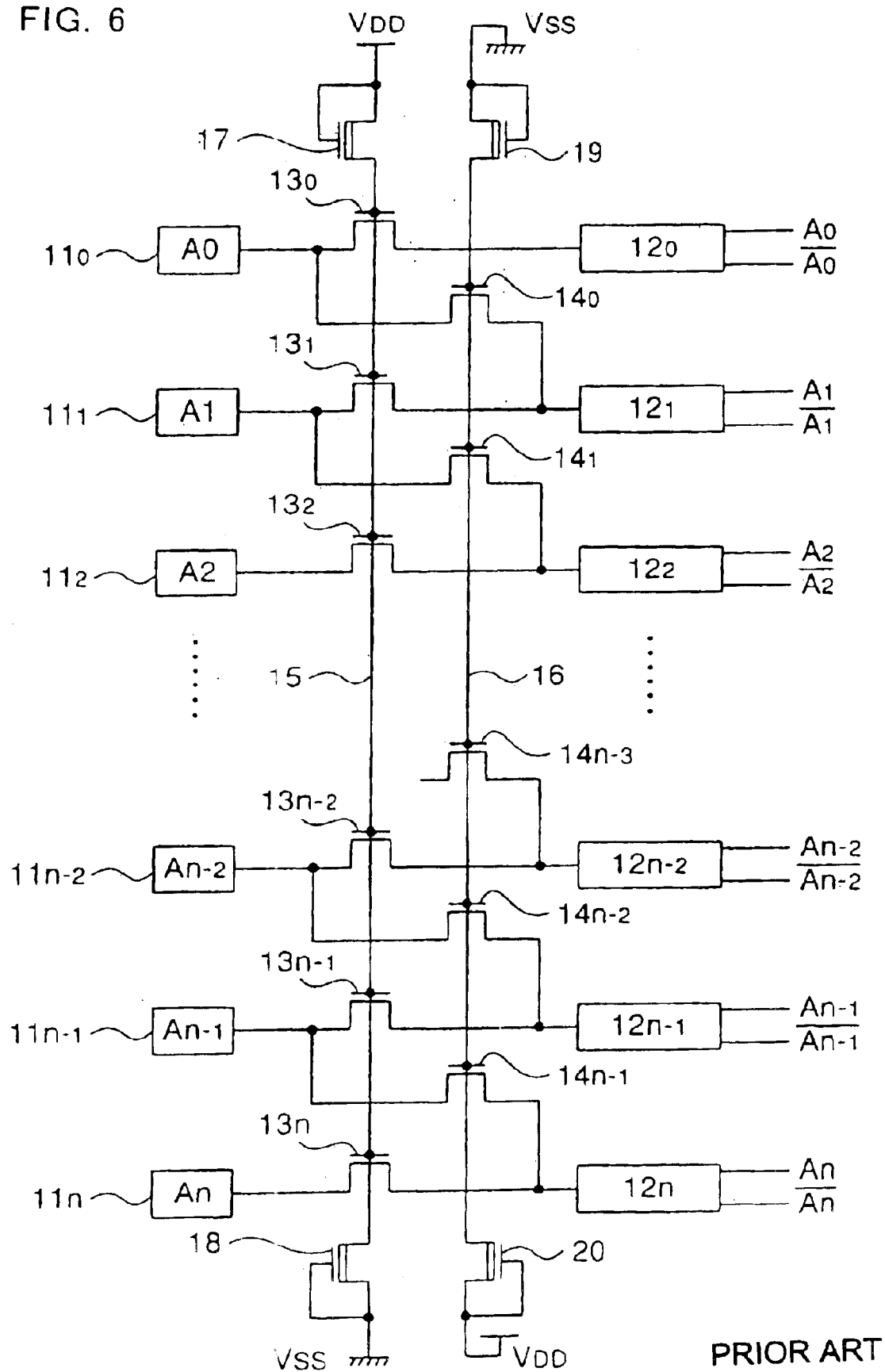
FIG. 6 is an explanatory diagram illustrating the construction of an address data input section of a conventional semiconductor memory.
Figure 7:
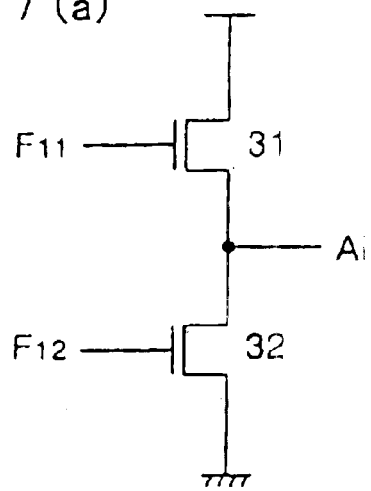
FIGS. 7(a) and 7(b) are explanatory diagrams illustrating the constructions of conventional address fixing circuits.
Figure 7:
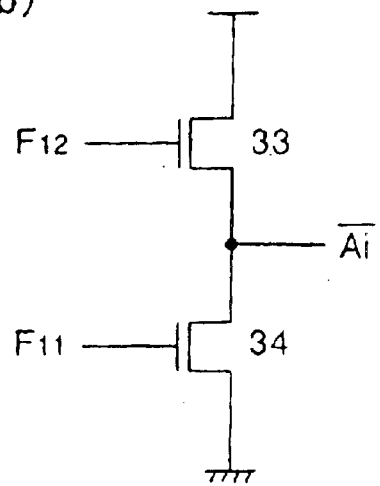
Figure 8:
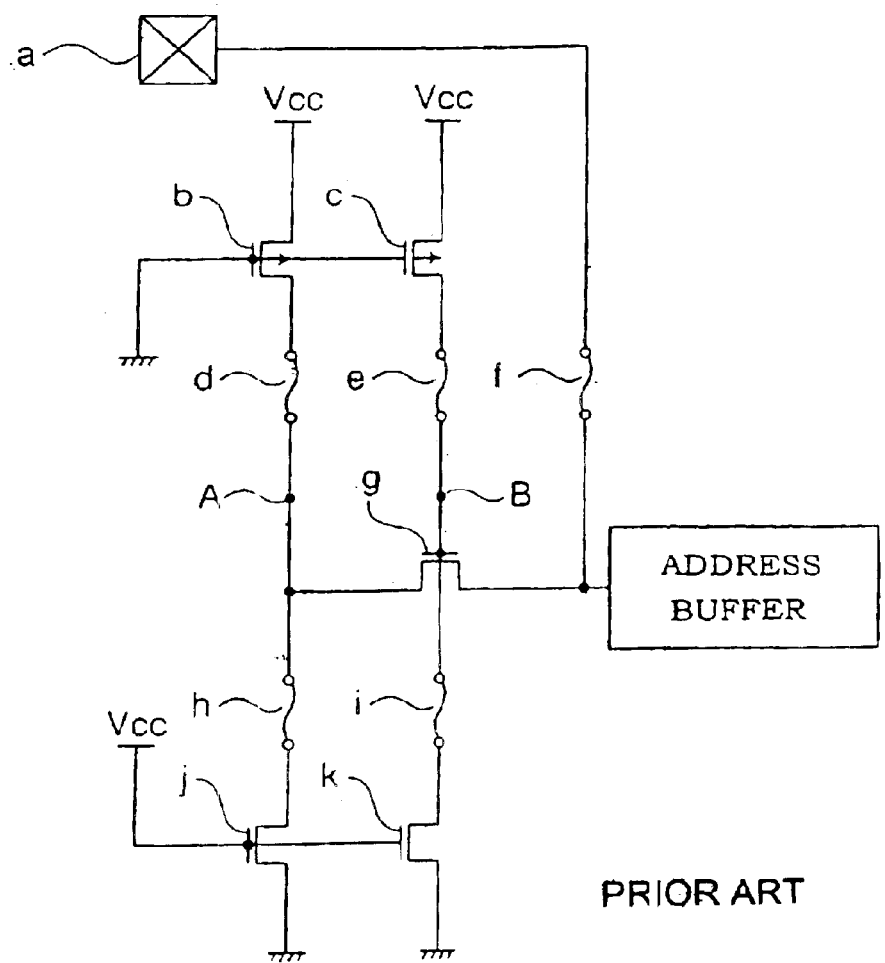
FIG. 8 is an explanatory diagram illustrating the construction of an address input circuit of another conventional semiconductor memory employing fuses.

FIG. 5 is an explanatory diagram illustrating a relationship between an address data value and an area designated by the address data value in the semiconductor memory.

Areas in the semiconductor memory are designated by the address data bits $A_0$ to $A_n$. An explanation will be given to a case where an area X is designated if the address data bit $A_n$ at the highest hierarchical level is at the logic "0" level ($A_n=0$) and an area Y is designated if the address data bit $A_n$ is at the logic "1" level ($A_n=1$) as shown in FIG. 5.

Where a defective memory cell (defective bit) occurs in the area X designated by the logic "0" level of the address data bit $A_n$ at the highest hierarchical level ($A_n=0$), the address data bit $A_n$ should be fixed at the logic "1" level ($A_n=1$) for discarding the area X.

To this end, the logic status of the control signals $S1_n$, $S2_n$ to be inputted to the address input selection circuit $C_n$ is set at (0,1) for fixing the output of the address input selection circuit $C_n$ at the logic "1" level.

At this time, the other address data bits $A_0$ to $A_{n-1}$ are respectively inputted to the address buffers $AD_0$ to $AD_{n-1}$ via the address input selection circuit $C_0$ to $C_{n-1}$ on an "as is" basis. Therefore, the control signals $S1_0$ to $S1_{n-1}$ and the control signals $S2_0$ to $S2_{n-1}$ to be inputted to the address input selection circuits $C_0$ to $C_{n-1}$ are set at the logic "1" level and at the logic "0" level, respectively. That is, the logic statuses of the control signals S1, S2 are set at (1,0).

Where defective memory cells occur in areas W1, W3 designated by the logic "0" level of the address data bit $A_{n-1}$ at the second highest hierarchical level ($A_{n-1=0}$), the address data bit $A_{n-1}$ should be fixed at the logic "1" level ($A_{n-1}=1$) for discarding the areas W1, W3.

To this end, the logic status of the control signals $S1_{n-1}$, $S2_{n-1}$ to be inputted to the address input selection circuit $C_{n-1}$ is set at (0,1) for fixing the output of the address input selection circuit $C_{n-1}$ at the logic "1" level.

At this time, the address buffer $AD_{n-1}$ is constantly kept at the logic "1" level and, hence, does not reflect the value of the address data bit $A_{n-1}$. Therefore, the address data bit $A_{n-1}$ is shifted to a one-bit higher hierarchical level so as to be inputted to the address input selection circuit $C_n$. To this end, the logic status of the control signals $S1_n$, $S2_n$ to be inputted to the address input selection circuit $C_n$ is set at (1,1).

At this time, the other address data bits $A_0$ to $A_{n-2}$ are respectively inputted to the address buffers $AD_0$ to $AD_{n-2}$ via the address input selection circuit $C_0$ to $C_{n-2}$ on an "as is" basis. Therefore, the control signals $S1_0$ to $S1_{n-2}$ and the control signals $S2_0$ to $S2_{n-2}$ to be inputted to the address input selection circuits $C_0$ to $C_{n-2}$ are set at the logic "1" level and at the logic "0" level, respectively. That is, the logic statuses of the control signals S1, S2 are set at (1,0).

Thus, the address data bit $A_{n-1}$ is shifted to the one-bit higher hierarchical level, so that the address buffer $AD_n$ reflects the value of the address data bit $A_{n-1}$. As a result, it looks as if the addressing could be achieved by utilizing the address data bits $A_0$ to $A_{n-1}$ with the address data bit $A_n$ at the highest hierarchical level being fixed at the logic "1" level.

Hence, even if the defective memory cells occur in the areas designated by the address data bit $A_{n-1}$, the semiconductor memory can be used as an acceptable memory having a memory capacity one half its original capacity without changing the positions of the address input terminals.

Similarly, where defective memory cells occur in areas designated by an address data bit value $A_{n-2}=0$, the address data bit $A_{n-2}$ should be fixed at $A_{n-2}=1$. To this end, the logic status of the control signals $S1_{n-2}$, $S2_{n-2}$ to be inputted to the address input selection circuit $C_{n-2}$ is set at (0,1).

At this time, the logic statuses of the control signals S1, S2 to be inputted to the address input selection circuits $C_{n-1}$, $C_n$ at higher hierarchical levels than the address input selection circuit $C_{n-2}$ are set at (1,1) so that the address data bits at one-bit lower hierarchical levels are shifted to be inputted to the address input selection circuits $C_{n-1}$, $C_n$.

Further, the logic statuses of the control signals S1, S2 to be inputted to the address input selection circuits $C_0$ to $C_{n-3}$ at hierarchical levels lower than the address input selection circuit $C_{n-2}$ are set at (1,0) so that the address data bits $A_0$ to $A_{n-3}$ are inputted to the address buffers $AD_0$ to $AD_{n-3}$ via the address input selection circuits $C_0$ to $C_{n-3}$ on an "as is" basis.

Thus, the address data bits $A_{n-2}$ and $A_{n-1}$ at the hierarchical levels not lower than the address input selection circuit $C_{n-2}$ having the fixed output level are shifted to the one-bit higher hierarchical levels, so that the address buffers $AD_{n-1}$ and $AD_n$ respectively reflect the values of the address data bits $A_{n-2}$ and $A_{n-1}$. Therefore, it looks as if the addressing could be achieved by utilizing the address data values $A_0$ to $A_{n-1}$ with the address data bit $A_n$ at the highest hierarchical level being fixed.

That is, an address input selection circuit $C_i$ at a given hierarchical level can be utilized for inputting an address data bit $A_{i-1}$ to an address buffer $AD_i$. Therefore, the user can assign the address data bits $A_0, A_1, \ldots,$ and $A_{n-1}$ to the address input terminals $L_0, L_1, \ldots,$ and $L_{n-1}$, respectively. Accordingly, the user can apply the address data bits $A_i$ in one-to-one correspondence with the address input terminals $L_i$. This obviates the need for changing the positions of the address input terminals.

Thus, the passage, fixing and shifting of the address data bits can be controlled simply by setting the logic statutes of the control signals S1, S2 to be inputted to the address input selection circuits. Therefore, even if a defective memory cell occurs in the semiconductor memory after the assembling, the semiconductor memory can be used as an acceptable device having a smaller memory capacity than its original capacity without changing the positions of the address input terminals. Further, the semiconductor memory is free from wasteful power consumption even when utilizing the full memory capacity, and obviates the need for cutting off an interconnection line.

According to the present invention, the passage, fixing and shifting of an address data bit can be controlled by means of a single address input selection circuit. Therefore, an address data bit to be inputted to a given address buffer can be shifted to an address buffer at a higher hierarchical level than the given address buffer with an input to the given address buffer being fixed, so that the address buffer at the higher hierarchical level reflects the value of the address data bit. Hence, even if a defective memory cell occurs in the semiconductor memory after the assembling, the semiconductor memory can be used as an acceptable device having a smaller memory capacity than its original capacity without changing the positions of the address input terminals. Further, the wasteful power consumption can be obviated.

What is claimed is:

1. A semiconductor memory having a plurality of memory cells, comprising:

a plurality of address pads for receiving plural address data bits respectively inputted thereto for designating memory cell areas;

a plurality of address buffers provided in one-to-one correspondence with the address pads for applying the address data bits to corresponding address decoders for selecting any of the memory cell areas; and a plurality of address input selection circuits respectively provided between the address pads and the address buffers, the address input selection circuits each comprising first to fifth gate circuits and first and second invertor circuits; wherein the address input selection circuits each receive first and second control signals each having either an L-level or an H-level, an address data bit applied from a corresponding one of the address pads and an address data bit applied from an address pad at a one-bit lower hierarchical level than the corresponding address pad, then select one of a signal fixed at either the L-level or the H-level, a signal indicative of the address data bit applied from the corresponding address pad and a signal indicative of the address data bit applied from the address pad at the one-bit lower hierarchical level than the corresponding address pad on the basis of the levels of the first and second control signals, and output the selected signal to the corresponding address buffer.

2. A semiconductor memory as set forth in claim 1, wherein the first to fifth transfer gate circuits each comprise an enhancement-mode P-channel MOSFET and an enhancement-mode N-channel MOSFET.

3. A semiconductor memory as set forth in claim 2, wherein the address input selection circuits are each constructed so that a line for the address data bit applied from the corresponding address pad is connected to the corresponding address buffer via the second and fourth transfer gate circuits, and a line for the address data bit applied from the address pad at the one-bit lower hierarchical level than the corresponding address pad is connected to the corresponding address buffer via the third and fifth transfer gate circuits.

4. A semiconductor memory as set forth in claim 3, wherein a line for the first control signal is connected to a gate of the P-channel MOSFET of the first transfer gate circuit and gates of the N-channel MOSFETs of the second and third transfer gate circuits, and further connected to a gate of the N-channel MOSFET of the first transfer gate circuit and gates of the P-channel MOSFETs of the second and third transfer gate circuits via the first invertor circuit.

5. A semiconductor memory as set forth in claim 4, wherein a line for the second control signal is connected to a gate of the P-channel MOSFET of the fourth transfer gate circuit and a gate of the N-channel MOSFET of the fifth transfer gate circuit, and further connected to a gate of the N-channel MOSFET of the fourth transfer gate circuit and a gate of the P-channel MOSFET of the fifth transfer gate circuit via the second invertor circuit.

6. A semiconductor memory as set forth in claim 1, wherein the address input selection circuits each output: the signal fixed at the L-level if the first and second control signals are both at the L-level; the signal fixed at the H-level if the first and second control signals are at the L-level and at the H-level, respectively; the signal indicative of the address data bit applied from the corresponding address pad if the first and second control signals are at the H-level and at the L-level, respectively; and the signal indicative of the address data bit applied from the address pad at the one-bit lower hierarchical level than the corresponding address pad if the first and second control signals are both at the H-level.

7. The semiconductor memory as set forth in claim 1, wherein if one of the memory cell areas fails, the semiconductor memory can be used as a memory having a capacity one half of the capacity of the semiconductor memory without a failed memory cell.

8. The semiconductor memory as set forth in claim 7, wherein respective positions of the plurality of address pads are not altered if the semiconductor memory is used as a memory having a capacity one half of the capacity of the semiconductor memory without a failed memory cell.

* * * * *